United States Patent
Cuchiaro et al.

[11] Patent Number: 5,888,585
[45] Date of Patent: Mar. 30, 1999

[54] PROCESS FOR MAKING AN INTEGRATED CIRCUIT WITH HIGH DIELECTRIC CONSTANT BARIUM-STRONTIUM-NIOBIUM OXIDE

[75] Inventors: Joseph D. Cuchiaro; Vikram Joshi; Claudia P. DaCruz; John M. McNelis; Carlos A. Paz de Araujo, all of Colorado Springs, Colo.

[73] Assignee: Symetrix Corporation, Colorado Springs, Colo.

[21] Appl. No.: 767,477

[22] Filed: Dec. 16, 1996

Related U.S. Application Data

[62] Division of Ser. No. 597,425, Feb. 8, 1996, Pat. No. 5,751,034.

[51] Int. Cl.[6] ...................................................... B05D 9/12
[52] U.S. Cl. .................................. 427/126.3; 427/376.2; 427/421; 438/785
[58] Field of Search ........................... 427/126.3, 376.2, 427/421; 438/785

[56] References Cited

U.S. PATENT DOCUMENTS

| | | | |
|---|---|---|---|
| 5,011,796 | 4/1991 | Bridger et al. | 501/12 |
| 5,124,777 | 6/1992 | Lee | 357/51 |
| 5,138,520 | 8/1992 | McMillan et al. | 361/311 |
| 5,173,835 | 12/1992 | Cornett et al. | 257/310 |
| 5,342,648 | 8/1994 | MacKenzie et al. | 427/126.3 |
| 5,471,363 | 11/1995 | Mihara | 361/305 |

FOREIGN PATENT DOCUMENTS

WO 93/12542  6/1993  WIPO .......................... H01L 27/115

OTHER PUBLICATIONS

C. Chen et al., "Ferroelectric and pyroelectric properties of strontium barium niobate films prepared by the sol–gel method" J.Appl. Phys. 69 (3) 1 Feb. 1991, pp. 1763–1765.

C. Luk et al., "Characterization of strontium barium niobate films prepared by sol–gel process using 2–methoxyethanol", Thin Solid Films 298 (1997) pp. 57–61.

Primary Examiner—Robert Kunemund
Attorney, Agent, or Firm—Duft, Graziano & Forest, P.C.

[57] ABSTRACT

A charge storage device, such as an integrated circuit memory, including a dielectric comprising a barium-strontium-niobium oxide. A liquid precursor including the metals barium, strontium, and niobium is prepared and applied to a platinum electrode. The precursor is baked and annealed to form a dielectric having the formula $Ba_xSr_yNb_zO_{30}$, where x=1.3 to 3.5, y=1.5 to 3.7, and z=10. A top platinum electrode is then formed to provide a memory cell capacitor. Optimum results to date have been obtained with $Ba_2Sr_3Nb_{10}O_{30}$, which yields a memory cell dielectric with dielectric constant over 1000 and a leakage current of less than $10^{-5}$ amperes per square centimeter for voltages up to 5 volts.

7 Claims, 6 Drawing Sheets

5,888,585

PROCESS FOR MAKING AN INTEGRATED CIRCUIT WITH HIGH DIELECTRIC CONSTANT BARIUM-STRONTIUM-NIOBIUM OXIDE

This application is a divisional of U.S. patent application Ser. No. 08/597,425 filed Feb. 8, 1996 now U.S. Pat. No. 5,751,034 issued May 12, 1998.

BACKGROUND OF THE INVENTION

1. Field of the Invention

The invention in general relates to high dielectric constant materials for use in integrated circuits, and more particularly to integrated circuits incorporating thin films of barium-strontium-niobium oxides.

2. Statement of the Problem

It is well-known that there is a need for a high dielectric constant material suitable for use in integrated circuits. The most commonly used dielectric material in integrated circuits is silicon dioxide, which has a dielectric constant of about 4. Capacitors using such a material must have a large area in order to provide the capacitive values required in state-of-the-art integrated circuits. These large areas make it difficult to reach high densities of capacitive components in an integrated circuit. However, the use of other materials to provide the dielectric in integrated circuits has been hindered by the fact that materials with high dielectric constants usually have many problems such as: leakage of the dielectrics in the integrated circuit environment, degradation and breakdown of the materials caused by the stresses of fabrication and use over long time periods, and incompatibility of the materials with other common integrated circuit materials. For example, lead-zirconate-titanate, usually called PZT, a well-known material used in ferroelectric integrated circuits has a dielectric constant of about 800, but also contains lead, which tends, over time, to migrate to the silicon semiconducting portions of the integrated circuits, causing alteration of their semiconducting properties. Thus, the presence of lead in combination with conventional integrated circuit materials significantly reduces the long-term reliability of the integrated circuit. Barium strontium titanate has also been successfully used in an integrated circuit, but its dielectric constant is not as high as PZT. Titanium also has a large number of oxidation states which can, under certain conditions lead to defects in the crystal structure that can degrade the electrical performance of the material. As integrated circuits become smaller, it becomes more and more important to find a dielectric material that has a dielectric constant of 500 or more, but does not contain problematic elements. The lack of such a material is considered to be one of the serious roadblocks to higher density integrated circuit memories.

3. Solution to the Problem

The present invention solves the above problem by providing an integrated circuit incorporating an oxide of barium, strontium and niobium. Preferably the barium-strontium-niobium oxide is $Ba_2Sr_3Nb_{10}O_{30}$. Not only is the dielectric constant very high, but the leakage current is very low, indicating that it will perform well in a charge storage device, such as an integrated circuit memory, and as an insulator between conductive elements of the integrated circuit. Other formulations of BSN, such as $Ba_{1.3}Sr_{3.7}Nb_{10}O_{30}$, have also been found to have a high-dielectric constant and good electronic properties. Thus, there is a range of proportions of barium and strontium that provides high dielectric constant and good electronic properties. In this disclosure, we shall refer to the foregoing materials, and any metal oxide in which the metals are primarily barium, strontium, and niobium, as BSN. BSN is intended to include materials that are doped with smaller amounts of other elements; that is, the molecular amount of the dopant element is less than the molecular amount of either barium, strontium, or niobium in the BSN.

The preferred BSN material according to the invention has a dielectric constant of over 500 for all frequencies and nearly 1300 at low frequencies. In addition, it has a leakage current of less than $10^{-5}$ amps per square centimeter for a film thickness of about 1600 angstroms and voltages of up to five volts. It does not include any materials that are known to be incompatible with conventional integrated circuit materials or which have properties that can degrade the performance of the material. While the excellent properties of the material and the ability to make very thin films of the material that retain those properties make the invention of particular importance for integrated circuits. However, it also is of importance for any type of charge storage device. Numerous other features, objects and advantages of the invention will become apparent from the following description when read in conjunction with the accompanying drawings.

DESCRIPTION OF THE PREFERRED EMBODIMENT

Figure 2:
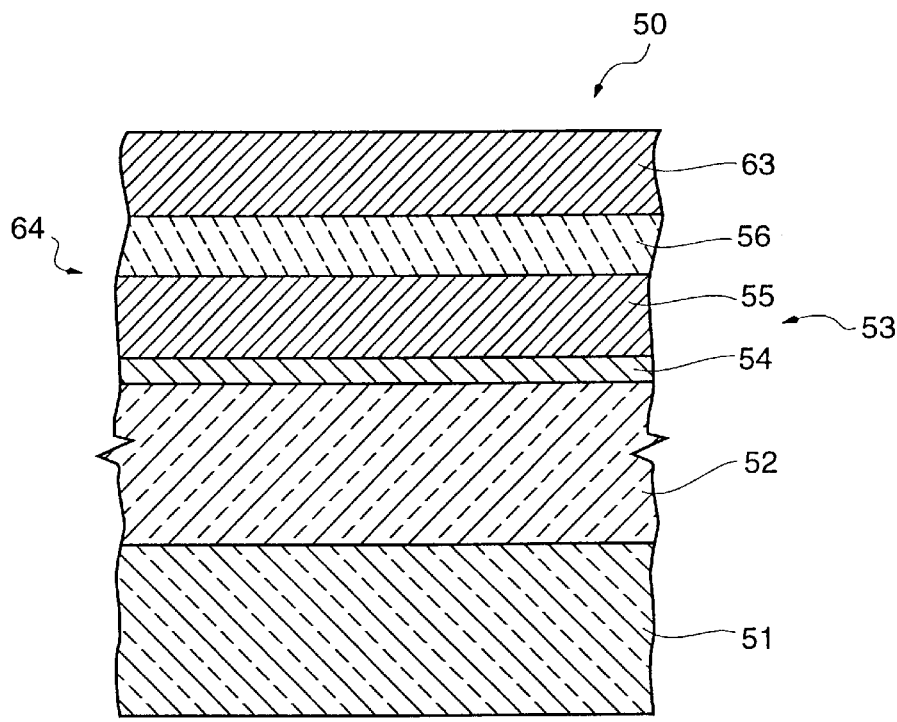
FIG. 2 is a cross-sectional view of a BSN integrated circuit capacitor according to the invention.
Figure 3:
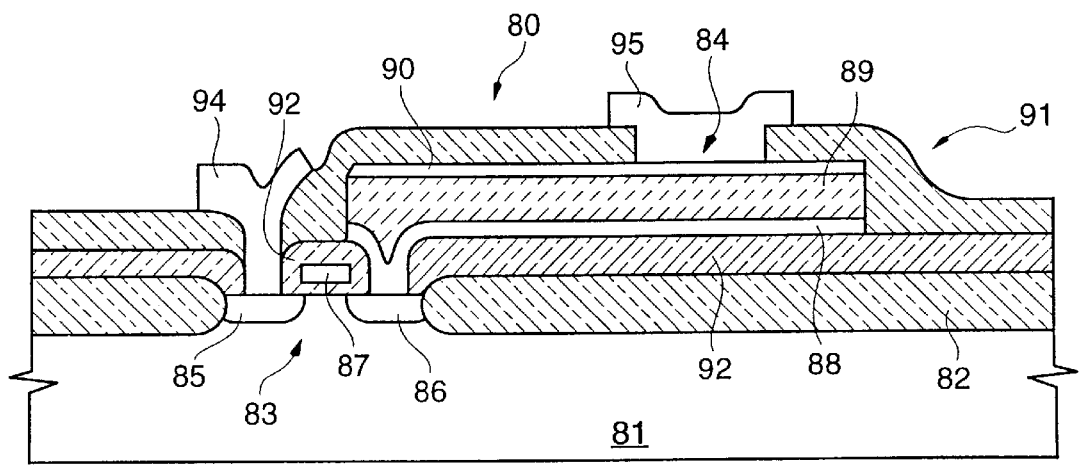
FIG. 3 is a cross-sectional view of a DRAM cell in which the integrated circuit capacitor of FIG. 2 may be incorporated.

Directing attention to FIG. 2, there is shown a cross-sectional view of an integrated circuit capacitor according to the invention. It should be understood that the FIGS. 2 and 3 depicting integrated circuit devices are not meant to be actual plan or cross-sectional views of any particular portion of an actual integrated circuit device. In the actual devices the layers will not be as regular and the thickness may have different proportions. The figures instead show idealized representations which are employed to more clearly and fully depict the structure and process of the invention than would otherwise be possible. Integrated circuit capacitor 50 is preferably formed on a wafer 51 that may be silicon, gallium arsenide or other semiconductor, or an insulator, such as glass or magnesium oxide (MgO). In the preferred embodiments described herein it is a P-type silicon wafer of about 100 centimeters in diameter. Preferably it is a single crystal. A layer 52 of about 5000 Å of silicon dioxide is grown on the silicon wafer 51 by conventional methods. Then the first electrode 53 is formed by first sputtering 200 Å of titanium 54 followed by 2000 Å of platinum 55. As is known in the art, the titanium assists in adhering the platinum 55 to the oxide 52. The incomplete device is then annealed in an oxygen furnace, preferably for 30 minutes at 650° C. Next the BSN insulator 56 is formed on the substrate 64, as will be described in detail below. Then, the second electrode 63 is formed, preferably by sputtering another 2000 Å thick layer of platinum. Further details of the capacitor formation process will be described below.

A DRAM (Dynamic Random Access Memory) charge storage cell 80 in which the invention may be used is shown in FIG. 3. The cell 80 is formed on a silicon substrate 81, and includes field oxide areas 82, and two electrically interconnected electrical devices, a transistor 83, and a capacitor 84. Transistor 83 includes a source 85, a drain 86, and a gate 87. Capacitor 84 includes first electrode 88, dielectric layer 89, and second electrode 90. The first electrode is shown as a single element because of the scale of the drawing, though it should be understood that it will usually comprise two or more different layers, as discussed with respect to electrode 53 of FIG. 3 above. Insulators, such as 92, separate the devices 83 and 84, except where drain 86 of transistor 83 is connected to first electrode 88 of capacitor 84. Insulators 92 may also be made of the BSN material according to the invention. Electrical contacts, such as 94 and 95 make electrical connection to the devices 83 and 84 and to other parts of the integrated circuit 91.

Figure 1:
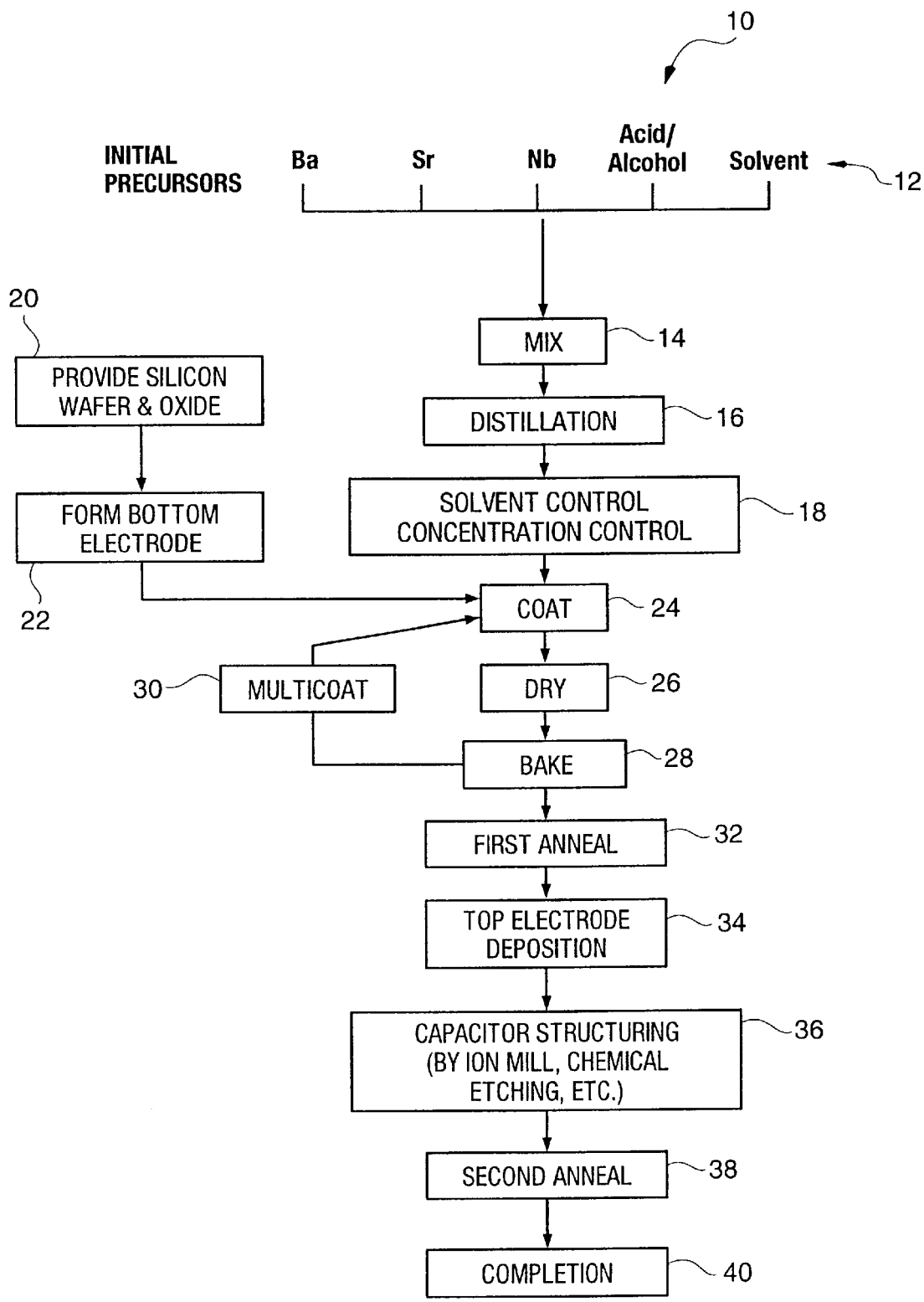
FIG. 1 is a flow chart showing the preferred embodiment of a process for forming a capacitor including a BSN insulator according to the invention.

Directing attention to FIG. 1, there is shown a flow chart of a generalized process 10 according to the invention for forming an integrated circuit capacitor 50, 84 (FIGS. 2–3). The process begins with the formation of a precursor solution, in steps 12 through 18, and the preparation, in steps 20 and 22, of the substrate 64 to which the precursor solution is to be applied. Both the words "substrate" and "precursor" are used ambiguously in the art. The word "substrate" can mean the underlying wafer 51, 81 on which the integrated circuit is formed as well as any object on which a thin film layer is deposited. In this disclosure "substrate" shall mean the object to which the layer of interest is applied; for example, when we are talking about a BSN insulating layer, such as 56, the substrate 64 includes the layers 51, 52, 54 and 55 on which the BSN layer 56 is formed. In the art, the word "precursor" can mean a solution containing one metal which is mixed with other "precursors" to form the solution to be applied to the substrate, or the solution which is applied to a substrate. In this discussion we shall generally refer to the individual precursors that are mixed to form the solution that is applied to the substrate as "initial precursors" and the precursor as applied to the substrate as the "final precursor" or just "precursor" unless the meaning is clear from the context. In intermediate stages the solution may be referred to as the "intermediate precursor".

The term "thin film" is used herein as it is used in the integrated circuit art. Generally it means a film of less than a micron in thickness. The thin films disclosed herein are in all instances less than 0.5 microns in thickness. These thin films of the integrated circuit art should not be confused with the layered capacitors of the macroscopic capacitor art which are formed by a wholly different process which is incompatible with the integrated circuit art.

In step P12 the initial precursors are formed. These may be formed by interacting each of the metals, i.e. barium, strontium, and niobium, or an alkoxide of the metal with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include: xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction.

In the preferred embodiment, niobium butoxide is reacted with 2-ethylhexanoic acid in a xylenes solvent, then the barium and strontium are reacted. Alternatively, individual initial precursors for barium, strontium, and niobium may be cold mixed in step 14. This mixed precursor prepared in step 14 is preferably the final precursor. However, optionally, the mixture may be further heated to distill it, or, in step 18 an additional solvent or solvents may be added just before application of the precursor to adjust the concentration to be optimum for the particular thin film to be formed. For example, n-butyl acetate may be added to adjust the viscosity and boiling point, or a solvent exchange step may take place simultaneously with or subsequently to the concentration adjustment, which solvent exchange step replaces one solvent with a second solvent. In steps 20 and 21 a substrate 64 is provided. The substrate generally would be an incomplete integrated circuit, or other electrical device. In the preferred embodiment the substrate 64 comprises a P-type silicon wafer 51, a layer 52 of silicon oxide, and the bottom electrode 53, which as described above, includes an adhesion layer 54 of titanium and a layer 55 of platinum. In addition, it may include a barrier layer of, for example, TiN or $TiO_2$. The barrier layer has usually been added in the prior art to prevent ion migration between the silicon of layer 52, the platinum, 55, and layer 56 of insulator. It is believed that the barrier layer or layers will not be necessary with BSN, though they may be added as a precautionary measure. The structure of such adhesion layers, barrier layers, and electrodes is well known in the art and will not be discussed in further detail herein.

In step 24 the final precursor is applied to the substrate 64. The application may be by a misted deposition process as described in U.S. Pat. No. 5,406,945, which is incorporated herein by reference, though other methods of applying a liquid to a substrate may be used. Preferably, a spin-on process is used. Preferably the wafer is spun at a spin rate of between 750 RPM and 6000 RPM for a period of 5 seconds to a minute, with these parameters depending on the concentration and viscosity of the solution being applied and the desired thickness of the resulting layer. In steps 26–32, the precursor on the substrate is then treated to form a polycrystalline, solid metal oxide thin film. The step of treating may include heating at temperatures below the anneal temperature of the material, i.e. baking, annealing, or an RTP (rapid thermal process) that may be either an RTP bake or an RTP anneal. Generally the treating is by heating, but as described in U.S. Pat. No. 5,456,945, it may alternatively or additionally be treated by exposing the substrate and precursor to a vaccum. In the preferred embodiment, the precursor is treated by drying in step 26, baking in step 28, and annealing in step 32. The drying step 26 is done at a temperature of between 100° C. and 350° C. for a time of between 30 seconds and 10 minutes, preferably on a hot plate. Preferably, the drying is done in a plurality of drying steps, each one at a higher temperature than the previous one. In the samples below, the drying was preferably done in two steps, one at 160° C. for one minute and another at 260° C. for four minutes. The bake step 28 may also include a rapid thermal "anneal" (RTA) bake or a furnace bake, though in the preferred embodiment it was a hot plate bake. If an RTA step 28 is utilized, it uses a halogen light source to raise the wafer rapidly to a high temperature in the range from 500° C. to 850° C. for a bake time of between 15 seconds and 3 minutes. The step 32 of annealing is done at a temperature of from 500° C. to 850° C. for from 30 minutes to three hours. In the examples below, the annealing was done at 800° C. for 60 minutes. The quality of the devices appears to depend on the time of push/pull and stabilization, thus this aspect will be described in more detail in each of the examples. If a single coat of precursor is applied, the drying step 26, the baking step 28, and the annealing step 32 are performed consecutively. However, usually two or more coats of BSN are formed. In a multiple coat process 30, the drying step 26 and the bake step 28 are performed after each application of the precursor, and then the next coat of precursor is applied. The anneal step 32 is preferably performed after all the coats of BSN are applied, but may be performed after each drying.

After the desired number of coats of precursor are applied, dried, baked, and annealed, the top electrode 63 is deposited in step 36, preferably by sputtering a layer of platinum. Then, in step 36, the capacitor is patterned in a conventional process, such as ion milling, chemical etching, etc. In the examples below, an ion milling process with a negative mask photolithography was used to delineate capacitors. The milling time was between 24 and 29 minutes depending on the sample. The resist strip was performed using a standard IPC with 350 watts of RF power for 40 minutes. The mask used resulted in an area of 7854 square micrometers for all capacitors. Then, in step 38, a second anneal is performed. The second anneal is at a temperature of from 500° C. to 850° C. for from 15 minutes to one hour. In the examples below, the annealing was done at 800° C. for 30 minutes with a ten minute push into the furnace and a ten minute pull out of the furnace. Finally, in step 40 the integrated circuit is completed using conventional processes.

Turning now to specific examples of the invention, examples of the process of preparing the precursors according to the invention and processes according to the invention utilizing the precursors to form capacitor devices are given below. All processes were performed at the atmospheric pressure in Colorado Springs, Colo., except where otherwise noted. Referring to FIG. 1, in step 12 the compounds shown in Table I were measured.

TABLE I

| Compound | FW | g | mmol | Equiv. | Vendor |
|---|---|---|---|---|---|
| barium | 187.33 | 0.4121 | 3.0008 | 2.0005 | Strem |
| strontium | 87.62 | 0.3941 | 4.4978 | 2.9985 | Strem |
| niobium butoxide | 458.48 | 6.8773 | 15.000 | 10.000 | Soliton |
| 2-ethylhexanoic acid | 144.21 | 13.633 | 94.535 | 63.024 | Aldrich |

In the above table and the tables below, "FW" indicates formula weight, "g" indicates grams, "mmoles" indicates millimoles, "Equiv." indicates the equivalent number of moles in solution, and "Vendor" indicates the company from which the chemical was purchased. The niobium butoxide and the 2-ethylhexanoate were placed in a flask, and mixed with 20 milliliters (ml) of xylenes. In this disclosure, "xylenes" indicates a commercially available xylene solution which includes the three different isomers of xylene. The mixture was heated at 165° C. on a hot plate while stirring for 18.5 hours. The heat was removed, then the barium and strontium were added and allowed to react completely. Then 20 ml additional xylenes was added and the heat was raised to a maximum temperature of 126° C. allowing all butanol to distil from the solution until a volume of about 26 ml was reached. The solution was diluted with an additional 30 ml of xylenes. This resulted in a $Ba_2Sr_3Nb_{10}O_{30}$ precursor solution of 0.050 mmoles per gram.

A substrate 64 as shown in FIG. 2 was prepared with a 200 Å thick sputtered titanium layer 54 followed by a 2000 Å thick layer 54 of sputtered platinum. The substrate was pre-annealed at 650° C. in oxygen for 30 minutes.

Four milliliters of the above precursor was mixed with 1 ml of n-butyl acetate to produce a final $Ba_2Sr_3Nb_{10}O_{30}$ precursor. A small amount of the final precursor was spun on the substrate 64 at 1500 rpm for 30 seconds. The precursor was dried on a hot plate at 160° C. for 1 minute and then at 260° C. for 4 minutes. Another layer was formed by spinning and drying. Then the wafer was annealed at 800° C. in oxygen with a 20 minute push into the furnace and a 20 minute pull out of the furnace. The final film was $Ba_2Sr_3Nb_{10}O_{30}$ 1615 Angstroms (Å) thick. A top electrode 63 of 2000 Å of platinum was added, and the capacitors patterned with an HDL negative mask, a TE-FE etch, and an IPC resist strip at 350 watts for 40 minutes. Then the second anneal step 38 was performed at 800° C. for 30 minutes in oxygen with a 10 minute push/pull.

Figure 4:
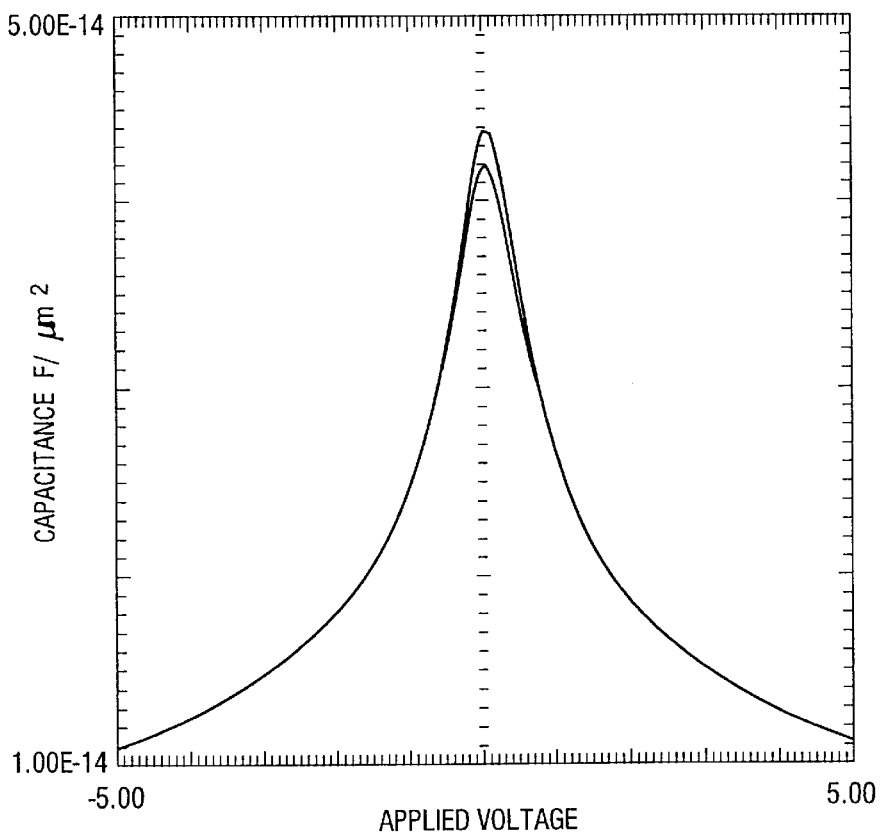
FIG. 4 is a graph of the measured capacitance versus bias voltage for a $Ba_2Sr_3Nb_{10}O_{30}$ capacitor according to the invention made by the process of Example 1.
Figure 5:
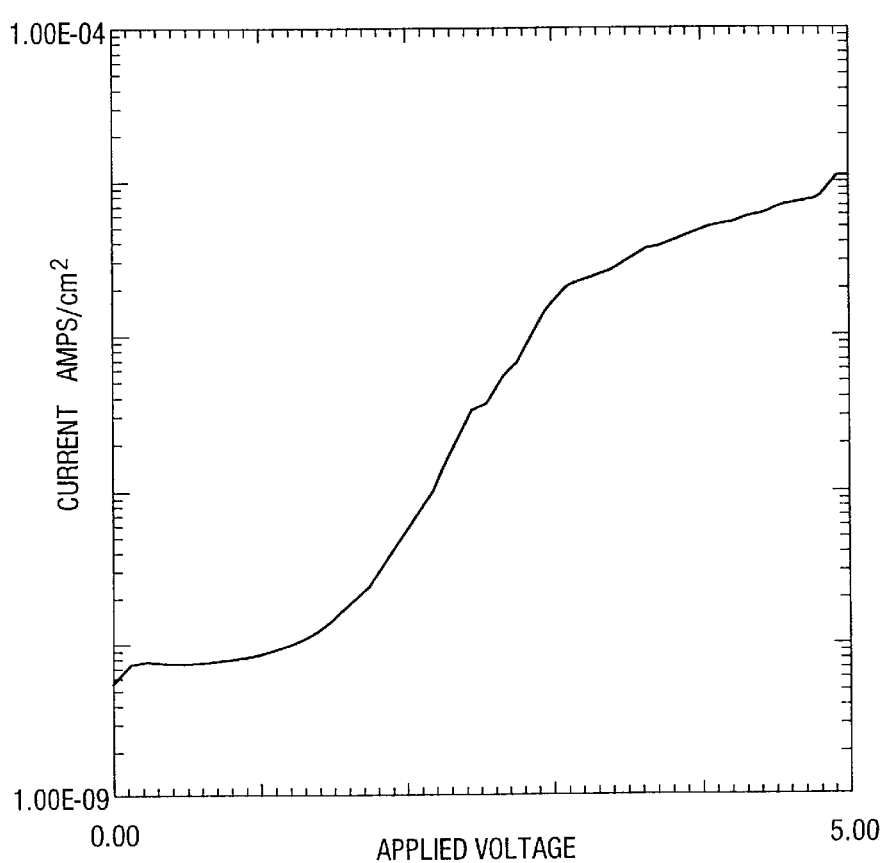
FIG. 5 is a graph of the measured leakage current versus bias voltage for the capacitor of FIG. 4.

The capacitance of a capacitor 50 made as described above was measured as a function of voltage with the result shown in FIG. 4. This measurement and all others mentioned below were at room temperature, i.e. 295° K. The higher curve is the sweep from positive voltages to negative, while the lower is the sweep from negative to positive. The capacitance peaks at about 42–44 femtofarads per square micrometer. In comparison, the best prior art BST capacitors of a similar thickness have a capacitance of about 25 femtofarads per square micrometer. The leakage current was measured and is shown in FIG. 5. The leakage current stays below $10^{-5}$ amperes per square centimeter for voltages up to 5 volts. While, at the higher voltages, this is not quite as good as the best BST prior art electrodes, this was a first run with BSN and it is likely that the leakage at voltages greater than about 2–3 volts is related to surface effects that will be eliminated as experience is gained with the material.

However, even this leakage current measured in this first run was sufficient for good, workable DRAMs.

EXAMPLE 2

Figure 6:
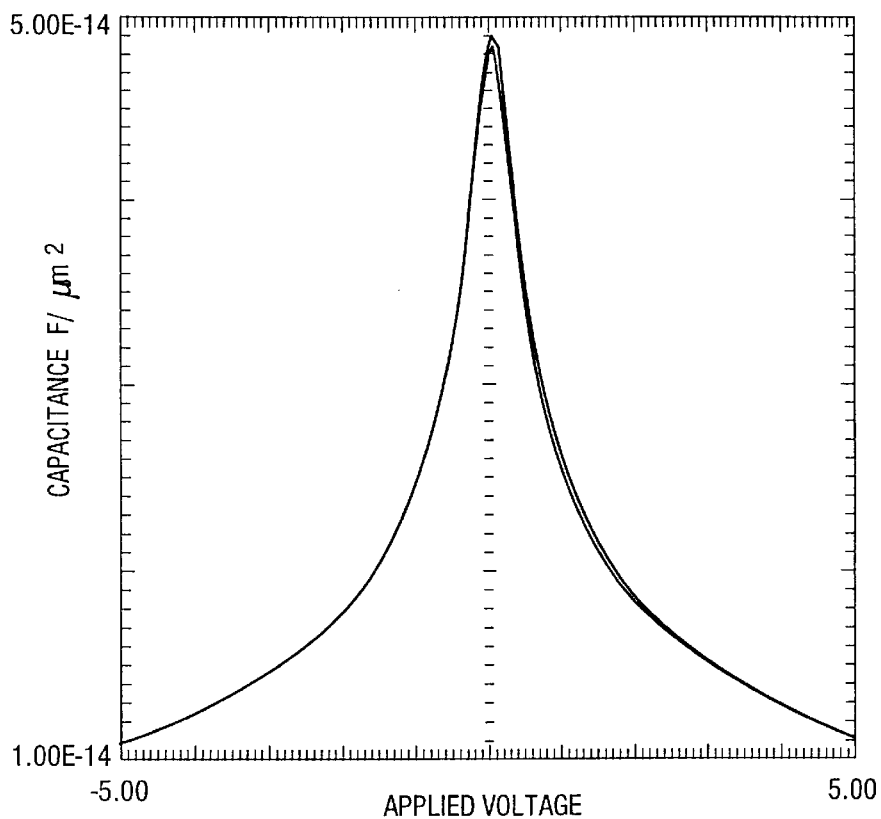
FIG. 6 is a graph of the measured capacitance versus bias voltage for a $Ba_2Sr_3Nb_{10}O_{30}$ capacitor according to the invention made by the process of Example 2.
Figure 7:
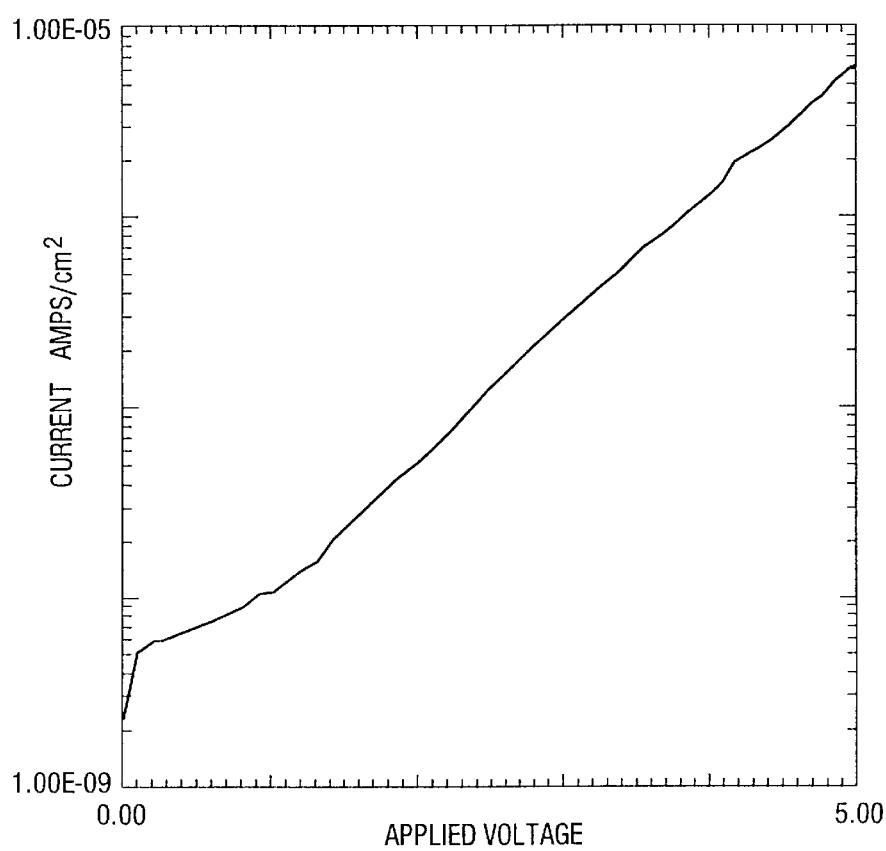
FIG. 7 is a graph of the measured leakage current versus bias voltage for the capacitor of FIG. 6.

Capacitors were made as described in Example 1 above except that the anneal step 32 was modified slightly. After drying the second coat, the wafer was placed in an elephant for five minutes in dry nitrogen to stabilize the temperature. Then the tube was purged with oxygen for another five minutes. Then the boat with the wafers was pushed into the furnace tube with a 30 minute push cycle at a 1.5 inches per minute spacial ramp, annealed for 60 minutes at 800° C., and pulled from the furnace in a 30 minute pull cycle, then cooled for 5 minutes in the elephant before the oxygen was shut off. The capacitor 50 had a BSN dielectric film having the formula $Ba_2Sr_3Nb_{10}O_{30}$ and a thickness of about 1600 Å. The capacitance and leakage current as functions of voltage were again measured, with the results shown in FIGS. 6 and 7, respectively. The capacitance went up to 49 femtofarads per square micrometer. The curves for both the positive to negative voltage sweep and the negative to positive voltage sweep are nearly on top of one another, showing excellent repeatability of the measurement, and the leakage current was slightly lower.

EXAMPLE 3

The compounds shown in Table II were measured. Then a process as described in Example 1 was followed to fabricate a capacitor 50 in which the dielectric 56 was BSN having the formula $Ba_{1.3}Sr_{3.7}Nb_{10}O_{30}$ and a thickness of 1663 Å. The capacitance dropped to about 35 femtofarads per square micrometer, and the leakage current was slightly higher. This initial result again suggested that this BSN material may result in better capacitors than BST, but the results were significantly less than for BSN of the formula $Ba_2Sr_3Nb_{10}O_{30}$.

TABLE II

| Compound | FW | g | mmol | Equiv. | Vendor |
|---|---|---|---|---|---|
| barium | 137.33 | 0.2676 | 1.9486 | 1.2992 | Strem |
| strontium | 87.62 | 0.4863 | 5.5501 | 3.7003 | Strem |
| niobium butoxide | 458.48 | 6.8769 | 14.999 | 10.000 | Unipin |
| 2-ethylhexanoic acid | 144.21 | 13.630 | 94.515 | 63.014 | Aldrich |

EXAMPLE 4

A further precursor was made as described in Example 3, except that a barium oxide precursor was made by reacting barium with 2-ethylhexanoic acid in xylenes to form an initial precursor with a barium molarity of 0.68M, and 0.10 milliliters of this initial barium oxide precursor was added to the precursor of Example 3 to form the final precursor. The rest of the process was as described in Example 1. The final thin film had about 5% excess barium and a thickness of 1520 Å. The measured capacitance was about 36 femtofarads per square micrometer, and the leakage current was about the same as for the device of Example 3. Thus the excess barium had some positive effect.

Figure 8:
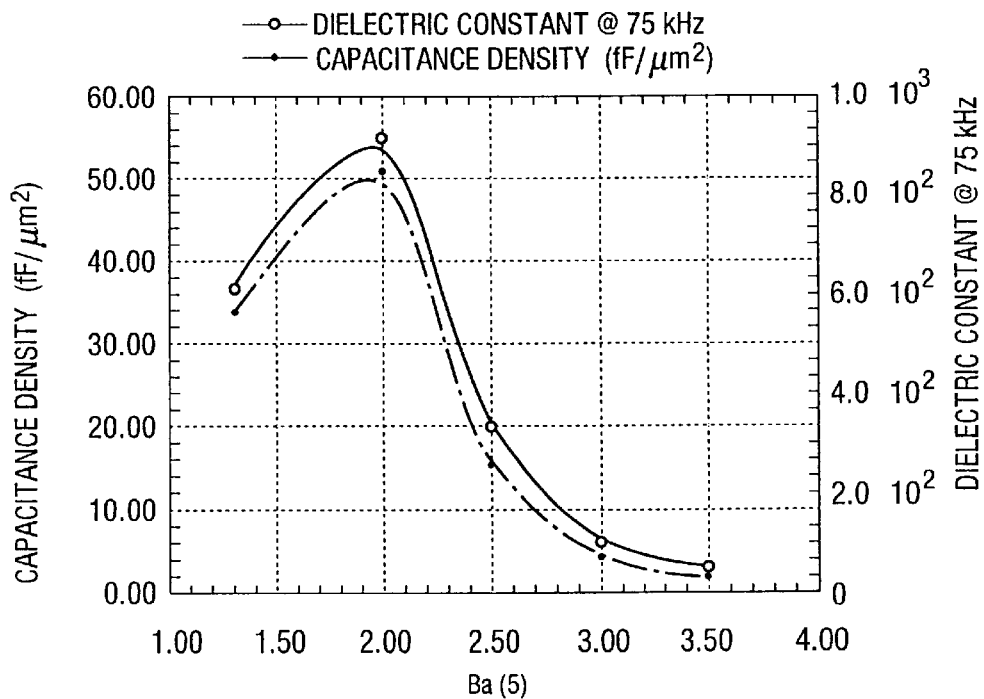
FIG. 8 is a graph of dielectric constant and capacitance density versus barium concentration for a series of BSN capacitors according to the invention.

Additional capacitors were fabricated with BSN dielectrics having the formulas $Ba_{2.5}Sr_{2.5}Nb_{10}O_{30}$, $Ba_3Sr_2Nb_{10}O_{30}$, and $Ba_{3.5}Sr_{1.5}Nb_{10}O_{30}$. The process was essentially the same as for Example 1. A plot of capacitance and capacitance density for the five different formulations of BSN (not including the excess Ba formulation) as a function of barium concentration is shown in FIG. 8. In the curve drawn through the points, the peak is estimated, since the exact point of the peak cannot be known without taking more data points between the 1.5 Ba point and the 2.5 Ba point. However, it is clear that there has to be a peak between these two points, which peak is believed to indicate a phase transition in the BSN material. It is believed that the high dielectric constant is associated with this phase transition.

Figure 9:
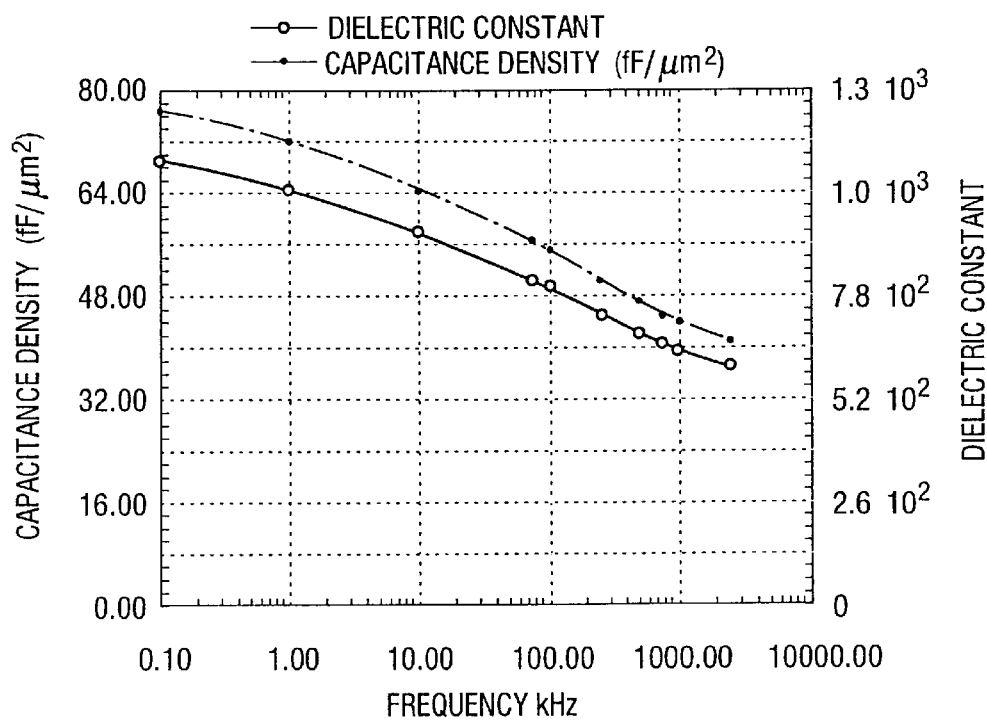
FIG. 9 is a graph of the dielectric constant and capacitance density for a $Ba_2Sr_3Nb_{10}O_{30}$ capacitor according to the invention.
Figure 10:
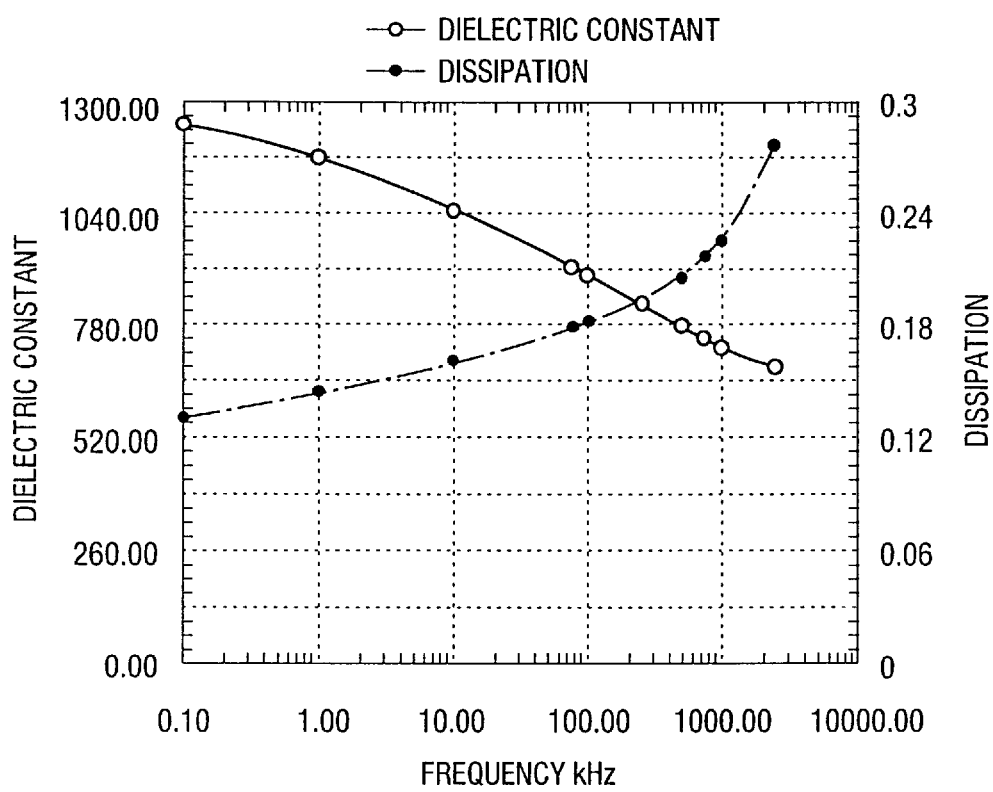
FIG. 10 is a graph of the dielectric constant and dissipation factor for a $Ba_2Sr_3Nb_{10}O_{30}$ capacitor according to the invention.

FIG. 9 shows the dielectric constant and the capacitance density of BSN having the formula $Ba_2Sr_3Nb_{10}O_{30}$ as a function of frequency, while FIG. 10 shows the dielectric constant and dissipation factor as a function of frequency. The dielectric constant falls off with frequency, but still stays significantly higher than prior art materials such as BST, which has a dielectric constant of about 400 at 10 megahertz. The dissipation increases with frequency, but much of this is believed to be a surface effect.

From the above it is seen that high dielectric constant capacitors were made having the formula $Ba_xSr_yNb_2O_{30}$, where x ranged from 1.3 to 3.5, y ranged from 1.5 to 3.7, and z was 10. The preferred range, i.e. the range within which the phase transition lies, is x=1.5 to 2.5 and y=2.5 to 3.5.

There has been described novel BSN precursors, novel thin film fabrication methods utilizing these precursors, and novel integrated circuit electronic devices utilizing the BSN materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the advantageous use of BSN in integrated circuits has been disclosed, the material can be advantageously used as an insulator in integrated circuit applications other than those described. Other processes may be used to form the BSN and BSN devices than the exemplary processes described above. It is clear from the above that additional formulations may be used, and it is expected that other dopant materials may be added. Further, the precursors, processes and structures can be combined with conventional processes to provide variations on the processes and devices described. It is also evident that the process steps recited may in some instances be performed in a different order. Or equivalent structures and processes may be substituted for the various structures and processes described. Consequently, the invention is to be construed as embracing each and every novel feature and novel combination of features present in and/or possessed by the precursors, precursor formation processes, electronic devices, and electronic device manufacturing methods described.

We claim:

1. A process for making an integrated circuit comprising:
   preparing a liquid precursor including the metals barium, strontium, and niobium;
   applying said liquid precursor to an integrated circuit substrate;
   treating said liquid precursor on said integrated circuit substrate to form a non-ferroelectric barium-strontium-niobium oxide; and
   completing the fabrication of said integrated circuit to include at least a portion of said non-ferroelectric barium-strontium-niobium oxide in an electrical component of said integrated circuit.

2. A process as in claim 1 wherein said step of treating comprises a step selected from the group comprising baking, annealing, or exposing to vacuum.

3. A process as in claim 1 wherein said barium-strontium-niobium oxide has the formula $Ba_xSr_yNb_zO_{30}$ where x=11.3 to 3.5, y=1.5 to 3.7, and z=10.

4. A process for making an integrated circuit as in claim 3 wherein x=1.3 to 2.5 and y=2.5 to 3.5.

5. A process for making an integrated circuit as in claim 4 wherein said metal oxide comprises $Ba_2Sr_3Nb_{10}O_{30}$.

6. A process as in claim 1 wherein said step of applying comprises:

producing a mist of said precursor; and flowing said mist into a deposition chamber to form a thin film of said liquid precursor on said substrate.

7. A process as in claim 1 wherein said step of applying comprises spinning said liquid precursor onto said substrate.

* * * * *